United States Patent [19]

Breton et al.

[11] Patent Number: 4,943,722
[45] Date of Patent: Jul. 24, 1990

[54] CHARGED PARTICLE BEAM SCANNING APPARATUS

[75] Inventors: Bernard C. Breton, Great Shelford; John T. L. Thong, Leckampton; William C. Nixon, Cambridge, all of United Kingdom

[73] Assignee: Trialsite Limited, United Kingdom

[21] Appl. No.: 100,751

[22] Filed: Sep. 24, 1987

[30] Foreign Application Priority Data

Sep. 24, 1986 [GB] United Kingdom ............... 8622976

[51] Int. Cl.$^5$ ............................................. H01J 37/28
[52] U.S. Cl. ................................. 250/310; 250/307
[58] Field of Search .............. 250/310, 307, 311, 309; 356/376

[56] References Cited

U.S. PATENT DOCUMENTS 3,927,320 12/1975 Chatfield et al. ................... 250/307
4,039,829 8/1977 Kato et al. ......................... 250/310

Primary Examiner—Jack I. Berman
Attorney, Agent, or Firm—Oldham & Oldham Co.

[57] ABSTRACT

Scanning beam apparatus adapted to display two views of a surface for stereoscopic viewing, wherein two series of electrical signals are obtained by scanning the surface with a normal and then tilted beam characterized by a frame store (36) to which the two series of electrical signals are supplied, the frame store including a feedback loop and input and feedback multiplying means (38, 40) and forming a recursive filter, and signal converter means for (42) including a red/green/blue look-up table memory means for generating red/-green/blue signals for display by a color monitor (44). Alternate tilting of the beam is achieved by adjusting during alternate scans the currents flowing in the gun alignment coils (12) of the SEM so as to shift the beam, and simultaneously introducing an offset in the signals applied to at least one other element (14 or 16) in the beam forming and focusing assembly, to counteract the shift introduced by the alignment adjustment, whereby the point of intersection of the beam axes follows the focal plane as focus is altered. The two video signals may be correlated to produce a correlation signal whose value for each point in the surface indicates the apparent shift in position of that point as between the normal and tilted beam scans, to produce a signal indicative for the surface topography. The correlating signal may be converted to a focusing control signal and may be enhanced by process for successive approximations.

21 Claims, 9 Drawing Sheets (a)　　　　　(b)

CHARGED PARTICLE BEAM SCANNING APPARATUS

FIELD OF THE INVENTION

This invention concerns charged particle beam scanning apparatus and in particular an improved apparatus and method of scanning for stereo image production and a method of quantitative evaluation of the topography of a specimen. The invention may be incorporated in scanning electron microscopes, electron microscopes used in the scanning mode, ion beam microscopes and the like.

The invention may be applied to the inspection and measurement of the topography of integrated circuits but is not limited to such applications and may be applied to any apparatus set to inspect the topography of any material (organic or inorganic) perpendicular to the plane of the scan.

BACKGROUND OF THE INVENTION

Stereoscopic imaging using a scanning electron microscope is conventionally achieved by tilting the axis of the scanning electron beam from one scan to another and displaying the two images in such a manner that the left eye of the observer sees one of the images and the right eye the other. Beams axis tilting is achieved in a variety of ways. Usually tilt deflection signals are applied to the main deflection coils or to a set of coils located beyond the final lens (usually referred to as post lens deflection coils).

SUMMARY OF THE INVENTION

According to one aspect of the present invention there is provided a charged particle beam scanning apparatus wherein alternate tilting of the beam to enable a surface to be viewed at different angles is achieved by adjusting during alternate scans the currents flowing in the gun alignment coils of an electromagnetic alignment system (or the electrical signals supplied to the gun alignment electrodes of an electrostatic system) so as to shift the beam, and simultaneously introducing an offset in the signals applied to at least one other element in the beam forming and focusing assembly, to counteract the shift introduced by the alignment adjustment.

The invention thus enables for example a non-stereo scanning electron microscope column to be adapted by merely changing the control signals supplied thereto, and with minimal constructional alteration, to produce signals suitable for the production of stereoscopic images or for topographic analysis.

It is a further advantage of the invention that by not using post lens deflection coils the tilt axis follows the movement of the focal plane, i.e the point of intersection of the two beams always lies in the focal plane.

According to another aspect of the present invention in a scanning beam apparatus adapted to produce two series of electrical signals, one of which is obtained by scanning a surface with a beam whose axis is at one angle to the surface and the other of which is obtained by scanning the same surface with the axis of the beam at the surface at a different angle or direction from the first, the two series of signals are stored in a frame store with recursive filtering and two video signals suitable for display on one or more visual display units (such as TV monitors) or for topographical analysis, are obtained in manner known per se by addressing the frame store in a synchronous manner.

Preferably the scanning beam apparatus is one in which the point of intersection of the two beam axes always lies in focal plane. Which is determined by and varies with adjustment of the focusing of the apparatus.

According to a further aspect of the present invention in scanning beam apparatus which is adapted to produce two series of electrical signals one obtained by scanning an object with a beam whose axis is at one angle at the surface of the object and the other obtained by scanning the same object with the axis of the beam at a different angle at the said surface, and in which the point of intersection of the two axes of the beam follows the focal plane as the focus is altered, and in which two video signals are obtained in manner known per se from the two series of electrical signals for topographical analysis and if desired also for display on a single visual display device such as a television monitor with the image produced in the display by the one signal being visually separable from that produced by the other signal as by colour, and in which means is provided to effect adjustment of the focal plane of the microscope, the improvement comprising:

calibrated focal plane adjustment means, whereby a depth measurement can be obtained as between two different points in the object one being spaced by a different amount from the beam forming assembly than the other, by adjusting the position of the focal plane of the beam so as to first coincide with the one and then the other of the two points and by determining from the calibration the distance (i.e. the depth) between the two points, in each case the position of coincidence of the focal plane and the respective point being determined by adjustment of the focal plane adjustment means so as to cause the two visually separable images of the said point in the display to merge.

According to a still further aspect of the present invention a method of determining the difference in height between two points in a surface in the field of view of a scanning beam apparatus, measured in a direction generally parallel to the beam, in which the surface is scanned first with the axis of the beam at one angle and then at a different angle, so as to obtain two series of electrical signals describing the surface for topographical analysis (and if desired also for display on visual display means, the displayed image corresponding to the one series of signals being visually distinguishable from the image corresponding to the other series) and in which the point of intersection of the two beam axes follows movement of the focal plane caused by adjustment of the focus, and wherein calibrated control means for adjusting the position of the focal plane is provided, comprising the steps of:

(1). adjusting the control means so as to move the focal plane relative to the surface and observing the two images of the one point in the display whilst adjusting the said control until the displacement of the two images of the one point is at a minimum, (at which position the focal plane will substantially coincide with the surface in the immediate vicinity of the one point), (2). repeating the process of alignment whilst concentrating on the said other point, and (3). noting the difference between the calibrated values of the control means at the two points of focal plane and surface coincidence.

By "height" is meant the perpendicular distance between the two regions of the surface containing the two points. In the case of a scanning electron microscope the column is generally perpendicular, in which event the spacing is indeed the height of the one point relative to the other.

According to a still further aspect of the present invention in a method of generating an electrical signal which describes the topography of a surface using a charged particle beam scanning apparatus which is adapted to produce two series of electrical signals one obtained by scanning the surface with a charged particle beam whose axis is at one angle at the surface of the object and the other obtained by scanning the same object with the axis of the beam at a different angle at the said surface, and in which the point of intersection of the two axes of the changed particle beams follows the focal plane as the focus is altered, and in which two video signals are obtained in manner known per se from the two series of electrical signals so that if desired they can be displayed on visual display means, the image produced in the display by the one signal being visually separable from that produced by the other signal for example by colour, and in which means is provided to effect adjustment of the position of the focal plane; the improvement comprising the steps of:

(1). correlating the two video signals so obtained and deriving a correlation signal whose value for each point in the surface indicates the apparent shift in position of that point during the tilted beam scan, and (2). processing the correlation signal as an electrical description of the topography of the scanned surface.

The correlation signal may be normalized relative to a reference value, by adding or subtracting an offset, typically of constant value.

Where the surface topography is well defined but involves only small variation in height, this signal will represent an approximation to the surface topography.

The method may advantageously include the further step of generating a focus adjusting signal by a process of successive approximation during a succession of scans, using the previously computed focus adjusting signal to adjust the beam focus during each successive scan, and processing the final focus adjusting signal as the electrical signal descriptive of the topography of the scanned surface.

This extension of the method allows the process to be applied to surfaces having very large topographical contrast (i.e substantial changes in height relative to some datum).

The process of successive approximation typically involves the employment of the previous best focus adjusting signal during subsequent correlation of the two video signals, so that successive correlation steps handle successively smaller apparent shifts.

When the apparent shift for any surface has been reduced to zero, or substantially so, the dynamic focus correcting signal will describe the topography of the scanned surface.

If the focus variation is not a linear function, the focus adjusting signal may be processed by a signal processing network having an appropriate non-linear input/output characteristic so as to produce a signal whose value follow more accurately the topography of the scanned surface.

The invention will now be described by way of example with reference to the accompanying drawings in which:

FIG. 1 illustrates schematically the construction of a conventional scanning electron microscope.

FIG. 2 illustrates a modified scanning electron microscope incorporating the first aspect of the present invention, FIG. 3 is a block schematic diagram of a scanning electron microscope system constructed as a second embodiment of the invention and adapted to enable objects to be viewed stereoscopically and which may incorporate the first aspect of the present invention, FIG. 4 is a block schematic diagram of one realization of part of the system of FIG. 3, FIG. 5 is a block schematic diagram of another realization of the same part of the system of FIG. 3, FIG. 6 is a block schematic diagram of a further realization of this part of the system of FIG. 3, FIG. 7 illustrates diagramatically how a tilted beam SEM (which may incorporate the first and/or second aspects of the invention) can be used to give a measure of height of a point of an object relative to another point therein, FIG. 8 is a block schematic diagram of a SEM system in which the beam axis is tiltable to enable objects to be viewed stereoscopically and in which adjustment of the focus can be made to determine the height of different points in the object, FIG. 9 shows how the relationship between incremental distance (height) and focusing current can be derived, FIG. 10 shows diagrammatically the variation of secondary electron (SE) intensity as a surface protrusion of a specimen is scanned using normal and tilted axis beams, FIG. 11 illustrates a system which enables topographic (height) measurements to be effected automatically, FIGS. 12a and 12b illustrate the principle of FIG. 10 more clearly, FIG. 13 illustrates normal and tilted incidence in a SEM.

DETAILED DESCRIPTION OF DRAWINGS

Figure 1:
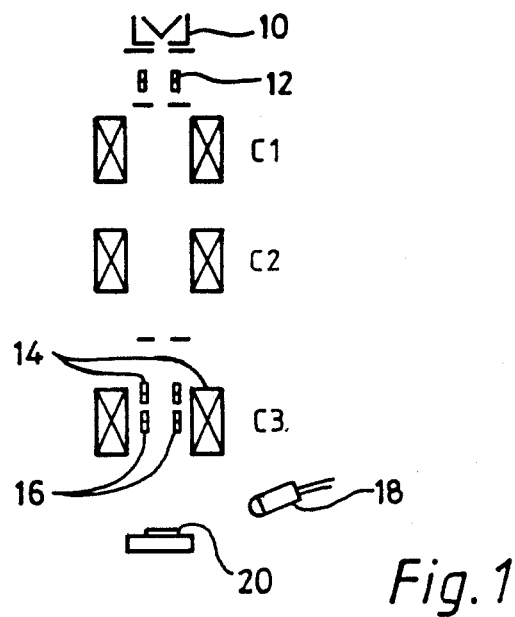

FIG. 1 illustrates a conventional scanning electron microscope with beam axis tilt coils located in the region of the final lens. Thus an electron gun assembly is shown at 10, gun alignment coils at 12, and scan deflection and image shift coils 14, 16. A PMT 18 detects secondary electron immission from a specimen 20. In known manner signals applied to the image shift coils 21 shift the axis of the electron beam from one frame to the next to enable stereoscopic viewing of the specimen.

Figure 2:
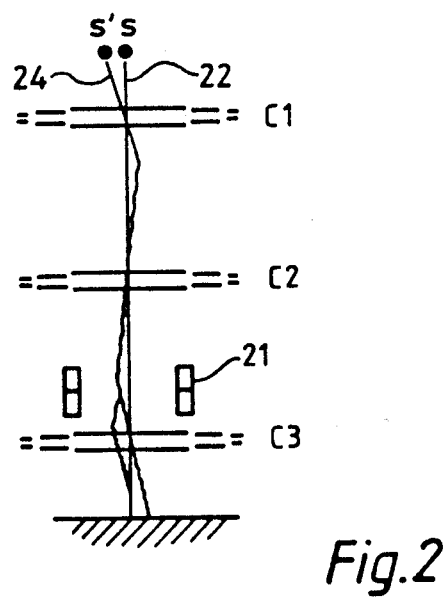

In FIG. 2 the principle of the first aspect of the invention is demonstrated in which a shift signal is added to the currents supplied to the gun alignment coils 12 and a complementary offset signal is applied to the shift coils 16, to bring the electron beam back to pass through the focal point. The solid line 22 illustrates the undeflected beam and the line 24 the path of the beam due to the shift and offset introduced by coils 12 and 16.

Figure 3:
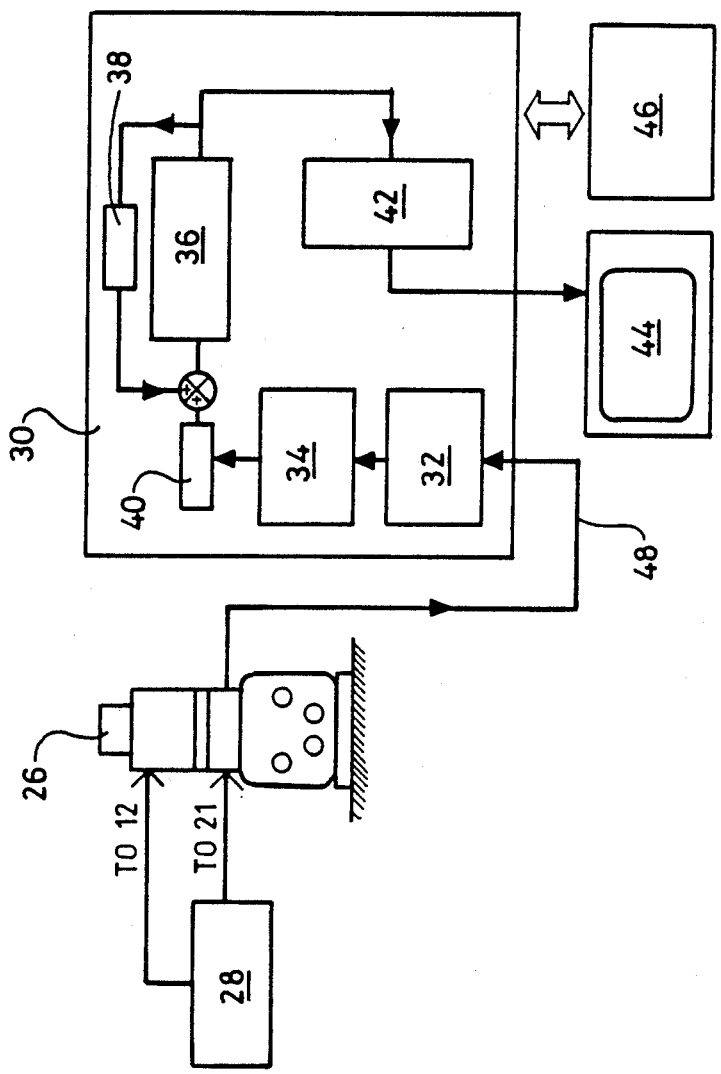

In FIG. 3 an SEM system is shown in which column 26 is supplied with control currents in known manner from a control centre 28 and the secondary electron emission current is supplied as a video signal to a signal processing system 30. This system includes an analogue to digital converter 32 and a preprocessor 34 by which different time related portions of the signal are given an offset so as to have a red or green modulation amplitude. These signals are supplied to a standard recursive filter comprising a single frame store 36 with feedback loop and input and feedback multiplying stages 38 and 40. The output for the filter is used in conjunction with a signal converter 42 containing a memory arranged as an RGB look up table, to produce either (R), green (G) or blue (B) signals for supply to a colour monitor 44. The digital signals from the filter and/or the converter 42 may be supplied to a computer 46.

The preprocessor 34, can operate in a variety of ways, but typically as shown alternate lines are stored as R and G signals in the frame store 36, for display using standard interlace between one frame and the next, each frame being made up of half the lines making up the full frame scan.

Figure 4:
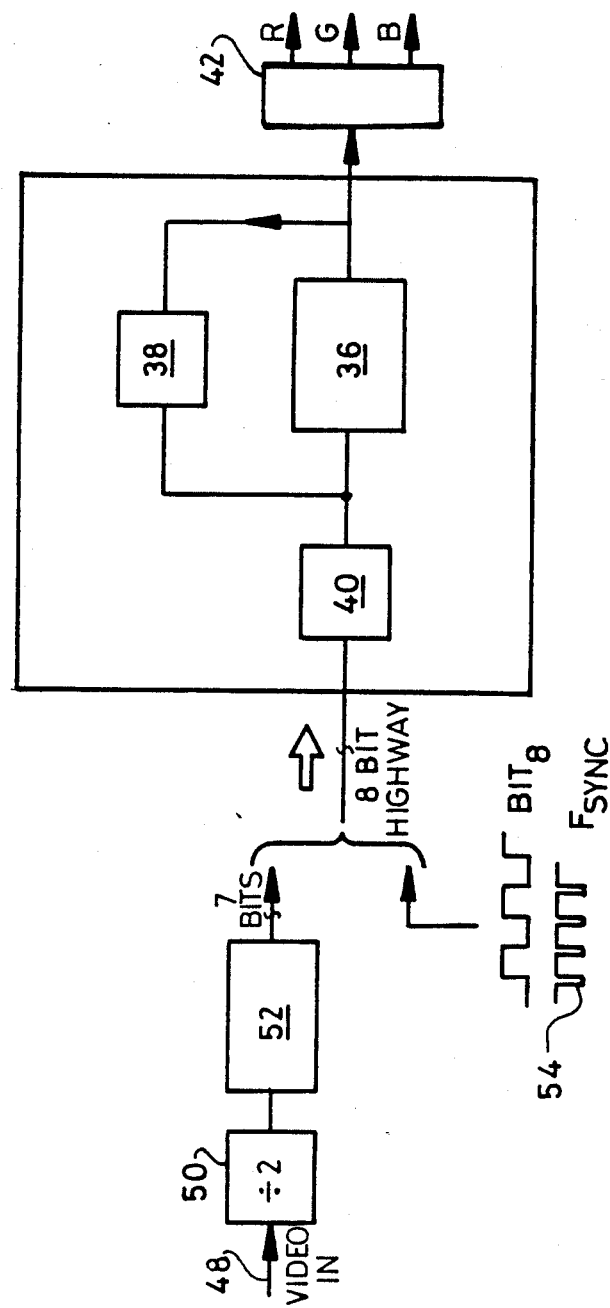

In FIG. 4 the actual steps of preprocessing to achieve standard interlace are shown. Thus the incoming video signal on line 48 of FIG. 3 is first of all attenuated so as to reduce the amplitude excursions by a factor of 2 in a "divide - by - two" network 50. This reduced dynamic range signal is then converted to a 7-bit digital signal by an ADC 52. Frame synchronizing pulses 54 are used to toggle a binary signal at the end of each frame scan period and the 1 or 0 value so obtained is combined as an 8th bit with the 7 bit signal to produce an 8 bit digital signal. By defining that all values below 128 produce for example a green hue of a varying brightness (depending on the actual value) and all values above 128 produce a red hue (again of varying brightness depending on the actual value). If the 8th bit is present during the nth frame, the displayed picture will appear red and if the 8th bit is missing during the (n+1)th frame, the displayed picture will appear green. Alternating the presence of the 8th bit between frame scans will produce the two red and green displays which if viewed through appropriate red and green spectacles, will enable the observer to view the displayed image stereoscopically.

The remainder of the circuit of FIG. 4 is essentially as shown in FIG. 3 and the same reference numerals have been used to denote similar parts.

Figure 5:
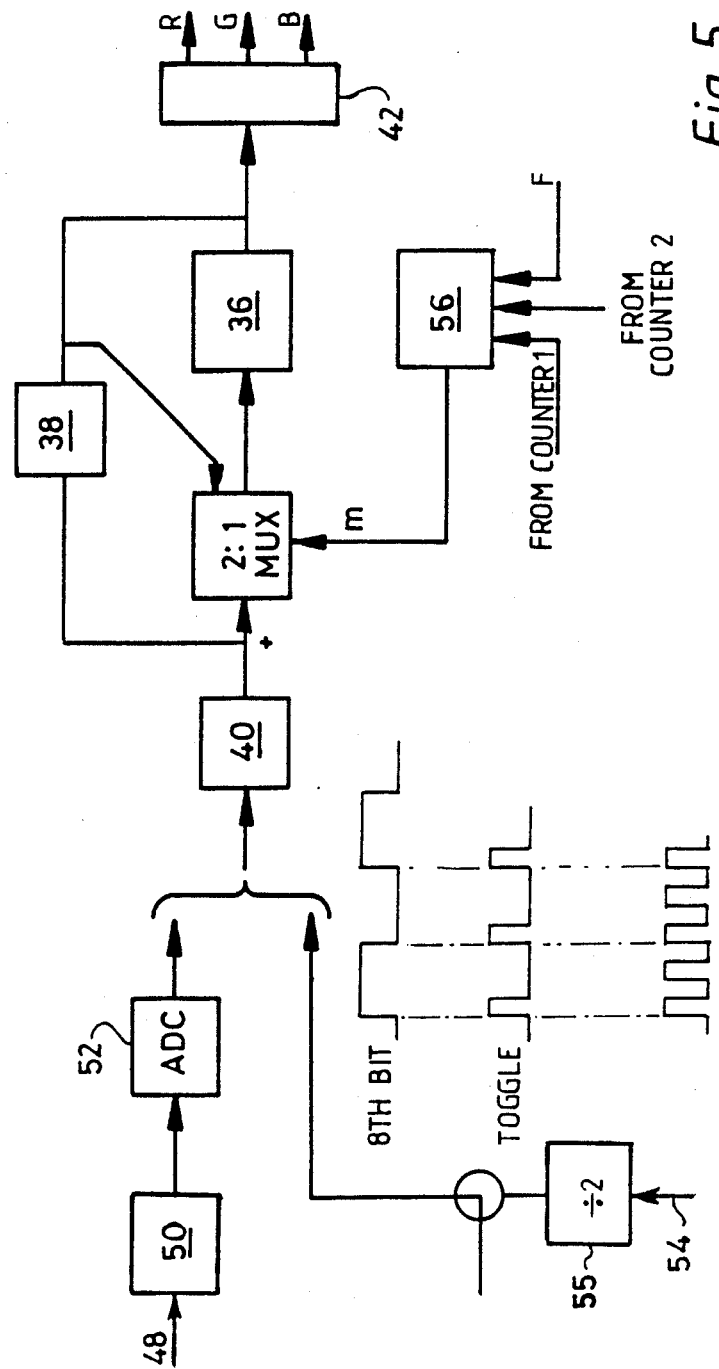

FIG. 5 illustrates how by increasing the rate at which the digitized video signal is converted to produce red and green image elements, so the flicker (which is present at normal T.V. scan rates when the circuit of FIG. 4 is employed) can be reduced or eliminated.

In FIG. 5 the frame synchronizing pulses 54 (having frequency F) of FIG. 4 are supplied to a frequency divider 55 so as to produce pulses at a frequency of F/2. These are used to toggle the value of a binary signal as before, but this time the value changes from 1 to 0 (and vice versa) at the end of every two frame scan periods. The final display is divided into a checker board pattern of alternate squares using a 2:1 multiplexer, for combining and routing the incoming signals from multiplier (40) and the recirculated signals from the frame store (36) from the second multiplier (38).

The multiplexing device includes as one of its inputs a signal from a chequer board generator 58 itself driven by a first counter (not shown) delivering the numerical values of the pixels along each scan line, and a second counter (not shown) delivering the numerical value of each line of scan. A toggle signal F corresponding to the half frame rate signal which as previously described, controls the 8th bit in the 8-bit signal, is also supplied to the multiplier (40).

The generator 58 operates so as to cause digital video signal values produced when the scanning beam axis is at one angle, to be stored in what would be "white" squares in the chequer board pattern and the digital values produced when the scanning beam axis is at the other angle, to be stored in what would be the "black" squares of the chequer board pattern.

This procedure reduces the flicker component in the final display.

Figure 6:
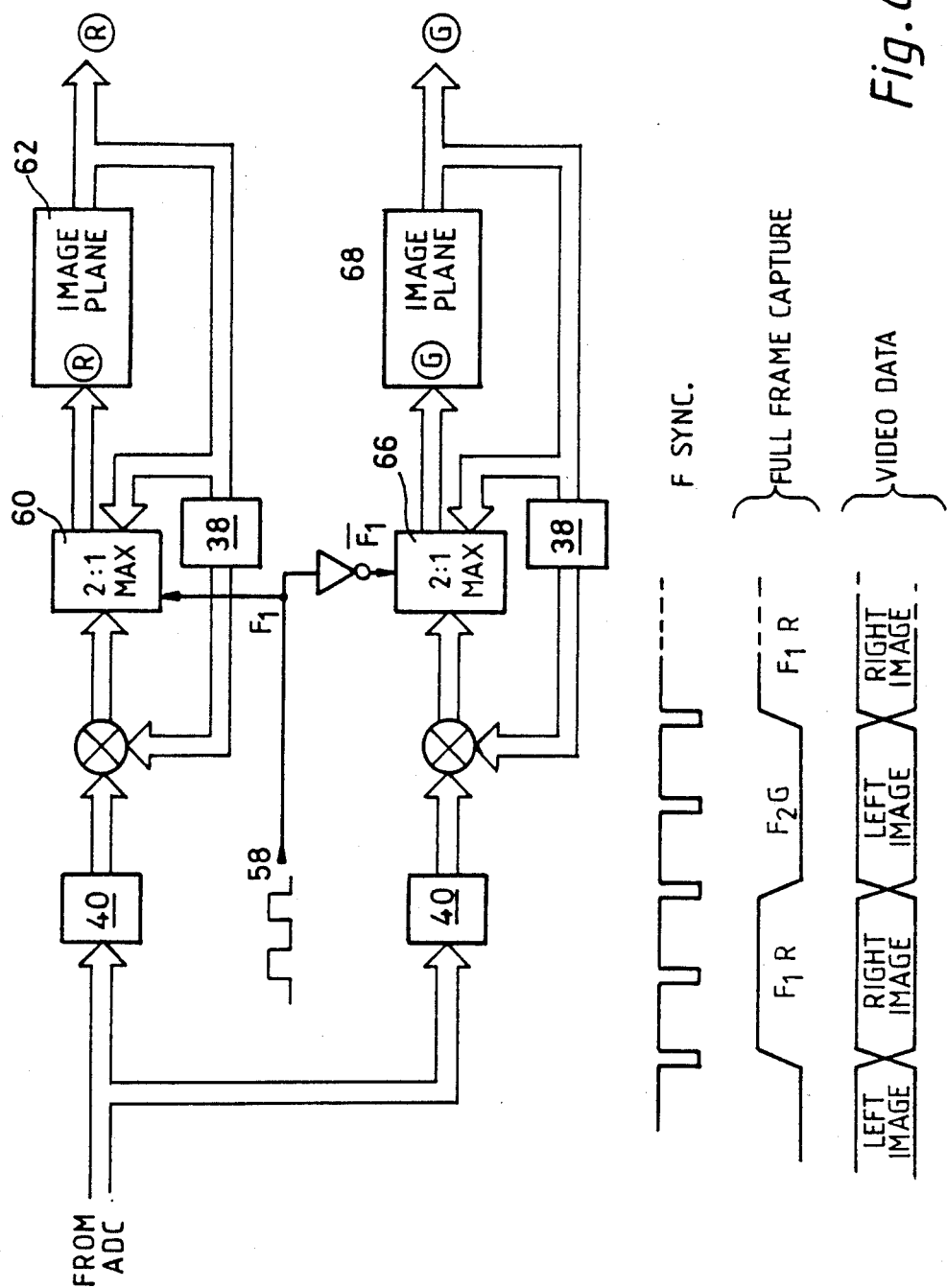

FIG. 6 shows how even greater resolution is possible in the final display by using two full frame stores and a toggle signal 58 (corresponding to one half the frame synch pulse rate) which enables a 2:1 multiplexer 60 in the input to the first frame store 62 during the first two frame scan periods and by virtue of a binary invertor 64, enables the other 2:1 multiplexer 66 during the next pair of frame scan periods. By synchronizing (in known manner) the tilting of the SEM beam axis to the successive pairs of frame scans, so the digital signals in store 62 will all correspond to one tilt angle and those in store 68 to the other tilt angle. The output from 62 thus produces for example the red (and the output from 68 the green) colour control signals, for a CRT display or the like, which as before is to be viewed through red and green spectacles.

Figure 7:
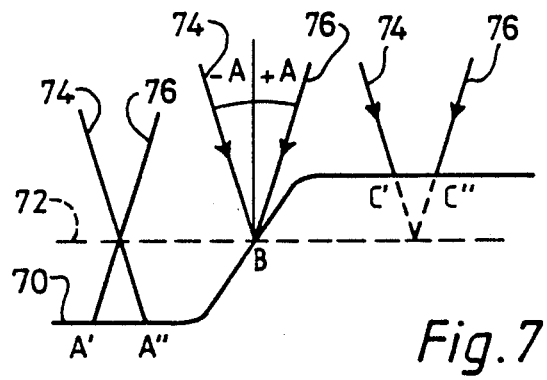

The beam tilting system described with reference to FIG. 2 ensures that the beam tilts around a point located in the focal plane. Any point in a specimen being so scanned can be determined as being "above" or "below" this plane, by virtue of the image "shifts" corresponding to the interception of the tilted beam with the surface. This can be seen with reference to FIG. 7 where 70 is a line defining the surface topography of a specimen when viewed in cross section, 72 is the position of the focal plane, and 74, 76 the two axes of the tilted beam shown at three different positions along a scan line tracking the section line 70. Thus where the point of convergence corresponds with the surface, as at B, both "red" and "green" images of this point will coincide. However, the surface levels "below" the focal plane 72 (as at a', a'') and above the focal plane 72 (as at c', c''), the red and green images will not coincide. If 74 determines the red image and 76 the green image, then "below" 72 the green image will appear to the left of the red and "above" 72 the green image will appear to the right of the red.

If the resolution of an unmodified tilted beam SEM is sufficient, the red and green signals may be obtained in conventional manner. If however, the different heights due to the topography of the specimen surface are very small and high magnification is needed then the modification described with reference to FIGS. 3 to 6 herein may to advantage be employed since this has been found to enhance the signal to noise ratio quite dramatically with the result that much greater magnifications can be employed whilst viewing specimens stereoscopically, than has hitherto been the case.

Whichever system is employed, the topography of the specimen surface is manifested by fringes where the specimen surface does not lie in the focal plane. Thus it is possible to see immediately from the stereoscopic display whether any particular feature in the surface of the specimen is in focus or not and depending on the relative positions of the "green" and "red" fringes, whether the feature is below or above the focal plane.

Figure 8:
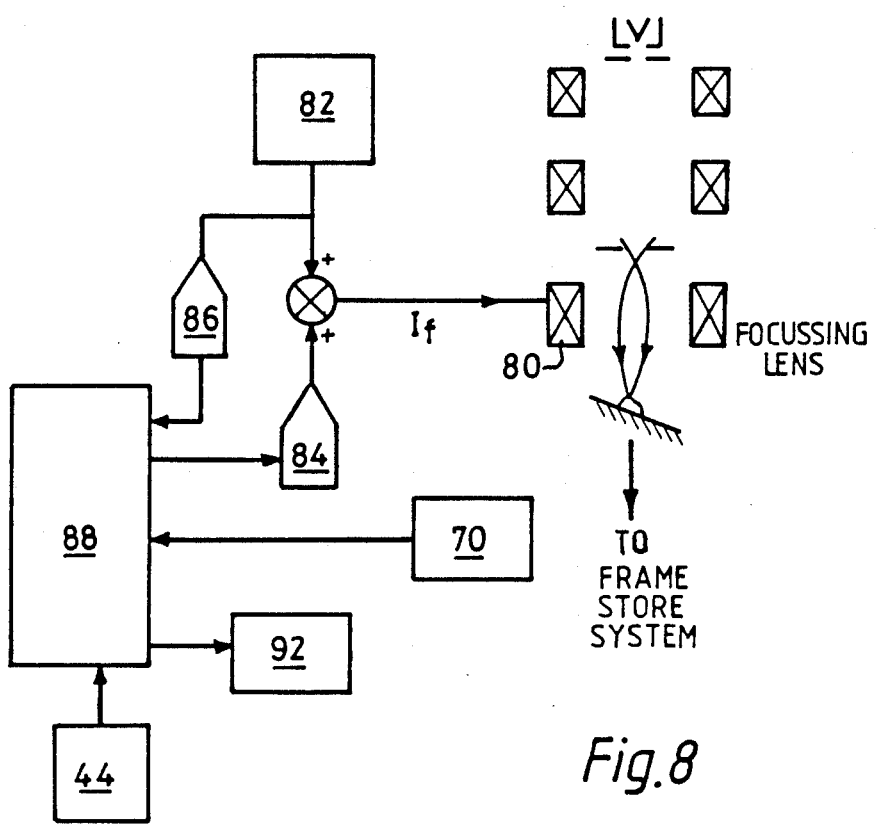

FIG. 8 shows how topography can be mapped using a calibrated "focus" control of a tilting beam SEM. When looked at FIG. 3, the system will include a recursive filter to improve signal to noise ratio. This is not however essential for lower magnifications and it is to be understood that the SE signal from the SEM may be supplied to any suitable imaging system, capable of displaying to two signals as visually separable images in a display.

In FIG. 8 the focusing current If for the focusing lens 80 is derived from a manually operable focus current control 82 and from a DAC 84. An ADC 86 converts the current value set by control 82 into a digital value to serve as one input for a computer 88 receptive also of a fine focusing current control signal from a fine focus control 90, and produces therefrom the correction current dIf via the DAC 84 and a numerical height value for display in a digital readout 92 as a function of the value of the focusing current and the correction current dIf.

To use the system, the SEM is focused using controls 82 and 90 until one point on the specimen surface (say at the bottom of a depression in the surface) is in focus in the display. The numerical value in the display 92 is then set to zero by for example introducing an offset signal or the like into the computer 88. The fine focus control 90 is then adjusted until a second point on the surface (say in the surface region surrounding the depression) is brought into focus. The numerical value now shown by the display 92 will be a measure of the height of the one point (i.e. at the bottom of the depression) relative to the other point (at the top of the depression). The computer may be programmed to determine from other information such as inter alia the magnification of the SEM, a scaling factor which may be applied to the information before display on 92, so that the value shown corresponds to the actual height dimension (e.g. in microns or Angstroms) between the two points. Alternatively the scaling factor may be displayed separately as a numerical value to enable an operator to compute from it and the numerical value in the display 92, the actual height dimension as aforesaid.

In this system it is important that the operator is presented with a clear and relatively noise-free display, to enable the positions of focus to be determined accurately. To this end a system comprising a combination of FIGS. 3 and 6 herein should be employed.

Figure 9:
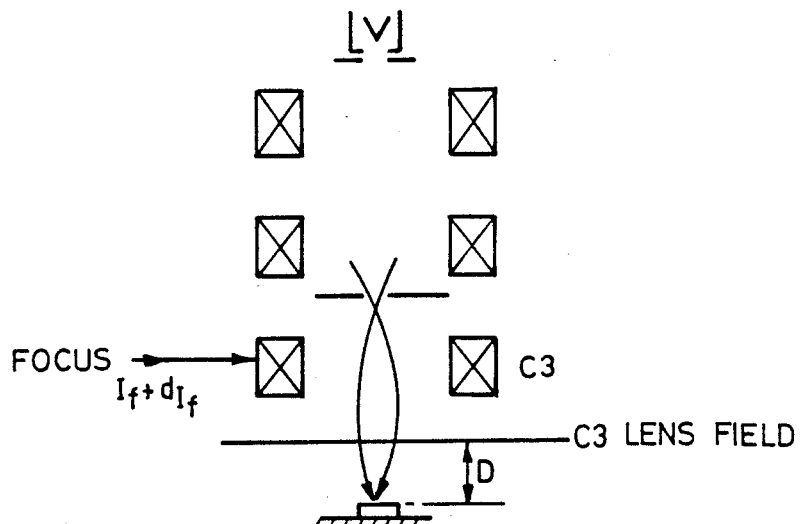

FIG. 9 enables a relationship to be established between the focusing current If and position of focus of an electron beam in a tilting beam SEM.

The distance D is a function of both If and the beam potential. If the electron gun voltage is constant, the relationship is simplified to $D = f(If)$.

Where
D = distance of focal plane from the final lens, and
If = the final lens current to achieve focus at D.
Differentiating indicates that:

$$dD/dIf = f'(If).$$

Where dD is very small, it is possible to consider that:

$$dD = dIf \cdot f'(If)$$

and since f'(If) is substantially constant for small changes in If, it will be seen that:

$$dD = K \cdot dIf \text{ (for constant beam voltage)}$$

Where
dD is the incremental change in height and
dIf is the incremental change in If needed to effect the dD change in focus.

This system can be automated to enable a signal describing the topography along a line or a surface to be obtained, and to assist in an understanding of the process to achieve this, reference will be made to FIG. 10.

Here the plan view of, and a cross section through a specimen are shown in FIG. 10(a) and FIG. 10(b) and the resulting SE intensity is shown graphically in FIG. 10(c).

The specimen surface shown in FIG. 10(a) and FIG. 10(b) has a protrusion or ridge having a "flat" top surface 100, two steeply sloping sides 102, 104 and a lower "flat" surface 106, 108 at the foot of each side.

The SE intensity which is detected as a tilted beam scans along the line 110, with the focal plane set at the level of the top 100, is shown by the dotted line 112.

The SE intensity which is detected as a tilted beam scans along the scan line but this time with the focal plane at the level of the lower surface (106, 108) is shown by the chain dotted line 114.

Lastly the SE intensity which is detected as a "normal" beam scans along the scan line, is shown by the solid line 116.

If the focus can be dynamically adjusted so that the pivot point of the tilt axes (i.e. the focal point) tracks the surface topography during any such scan, then the image due to the tilted axis beam will coincide with the image due to the "normal" incidence beam. This enables a criterion for "best profile match" to be determined by a process of correlation between signals obtained during the two scans. An iterative process of correlation is preferred and will be described later.

Refocusing thus tracks the topography of the surface and since small changes in focus are proportional to changes in the final lens excitation, it is possible (as already demonstrated) to plot focal-position variation, as variation in the focusing signal (typically an electric current).

Figure 11:
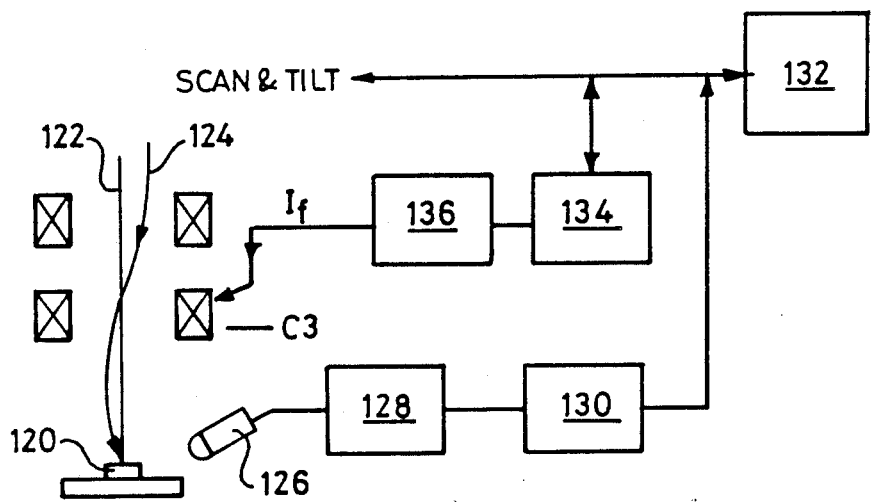

A system for achieving automatic topographical tracking is shown in FIG. 11.

In FIG. 11, a specimen 120 is successively scanned by a normal incidence beam 122 and by a tilted beam 124 and the SE current detected by a detector 126 in known manner. This current is amplified by 128 and digitized by ADC 130 and may be gated and processed between the amplifier 128 and ADC 130 by processing circuitry (not shown). A master controlling computer 132 controls the focusing current If (via DAC 134 and amplifier 136) and the tilt angle A of the tilted beam, and acquires the intensity data from ADC 130.

By varying the position of the focal plane (i.e. the point at which the normal and tilted beam axes intersect) between normal and tilted beam scans the position of a feature can be made to appear the same in both scans. This will occur when the focal plane intersects the feature. If the focussing is following the surface topography, there will be good correlation between the signals produced by the normal and tilted scanning and the computer 132 can be programmed to look for optimal correlation of the signals arising from the scanning.

A simple measurement of the apparent shift in position of a feature in an image arising from a tilted scan and a normal scan will give an approximation the relative height of the feature measured from the focal or tilt plane. Consequently an entire specimen profile may be determined by repeating this operation for each resolvable pixel in the image. While an individual picture point in an image contains little information to aid in locating the corresponding point in the tilt image, features may be conveniently matched by conventional cross correlation techniques provided no hidden views exist i.e. there are no features which disappear altogether when the beam is tilted or is normal, and that features in the image exist to begin with.

Of necessity image cross correlation implies the matching of finite areas between two images and image distortion arising from varying topography poses a limitation on the size of the correlation window which can encompass the feature under consideration at any time, in opposition to the reliability of the feature match. An improvement in the estimate of relative heights from image shift information, is obtained if the data is used to dynamically focus the beam (and hence modify the tracking of the tilt axis height) during subsequent iterations of image acquisition. The entire procedure may be repeated until the signal indicating the residual image shift has degraded to a desired level. Thus the focal or tilt plane converges on the actual profile being scanned in a closed loop system.

The equipment shown in FIG. 11 typically includes as part of the computer a digital image frame store such as is manufactured by Gems of Cambridge Limited and the computer itself may comprise a microVAX (Trade Mark) computer. As indicated in FIG. 11 the latter conveniently provides the beam tilting control and focus offset to the scanning electron microscope via a digital to analogue conversion stage typically a 12 bit DAC.

While the focus offset is typically applied to the final lens with its inherently long time constant (typically 100 milliseconds) the same effect may be obtained by electrostatic or electromagnetic focusing elements to achieve dynamic focusing at TV rates (10 megahertz) or faster as required, when driven by dedicated hardware. Image capture may then be carried out in the time frame required for the recursive filtering or averaging of the image, to the desired signal to noise ratio.

In use the SEM may be set to scan with normal incidence and the SE intensity signal is stored as a reference. The beam axis is then tilted by a known small angle (A) and with the lens excitation current set to position the focal plane somewhere below the lower surface 106 (of FIG. 10(b)), a first test SE signal is produced and differences between it and the reference are computed for each point of the scan and these differences are stored.

Figure 12:
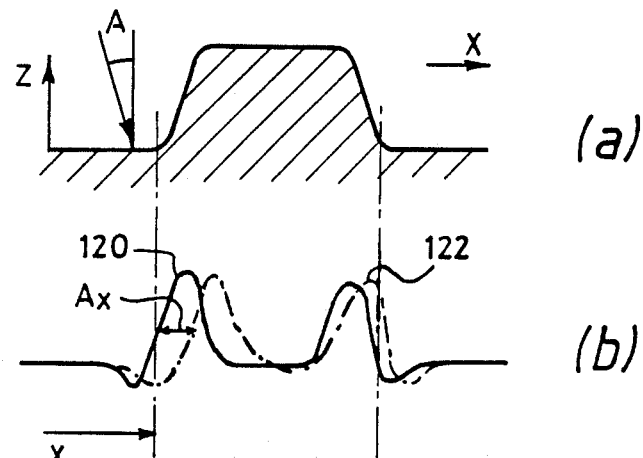

The specimen topography is shown in FIG. 12(a).

FIG. 12(b) illustrates what happens to the SE signal during a scan more clearly than FIG. 10, since only the normal (reference) SE image and the first (tilted test) SE image are shown at 120, 122 respectively. The specimen topography producing them is shown in FIG. 12(a).

In a preferred method of operation, to be described more fully later, an estimating function linking dD with dx and A (the angle of the tilt) may be used to determine a first estimate of the values of dD (and hence the correcting currents needed at different points along the line) to alter the position of the focal plane so as to more nearly follow the line 120.

Each set of correcting current values so obtained may be stored and used during successive scans to dynamically alter the focus of the SEM during subsequent scans and further correction current values are obtained using the estimating function during each successive scan. During each scan the computed dD values are compared with the previous ones and the best value for dIf determined in turn for each point (from the values of dx), until no significant change is observed between the computed values for dIf and those stored from the previous scan. At that stage it can be assumed that the stored values of dIf correspond to the corrections needed to the focusing current to follow the topography of the surface and by using the relationship between dIf and dD it is possible to thereby plot the height of all points along the line which intercepts the feature.

It is to be understood that it may not be possible to achieve a perfect match between the stored and the newly arising values of dIf and either the condition of identity can be defined as being when the difference value is less than a given minimum value or for example if after N attempts, no decrease of any significance can be detected between stored and newly arising dIf values.

It is further to be understood that it will usually be necessary to define electronically the region of the specimen which is to be topographically mapped. This may be done by defining an electronic acceptance window and eliminating from consideration any SE signals arising outside the window.

Figure 13:
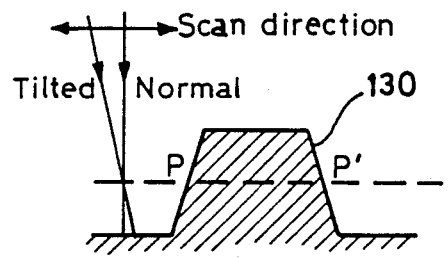

FIG. 13 illustrates the principal involved where the focal plane PP', also indicates the position of the pivot point of the tilting beams. All points above or below the focal (pivot) plane suffer shifts in image position (relative to the image obtained with normal incidence) when the beam is tilted. This appears as colour fringes in a composite stereoscopic image made up of two differently coloured images.

Figure 14:
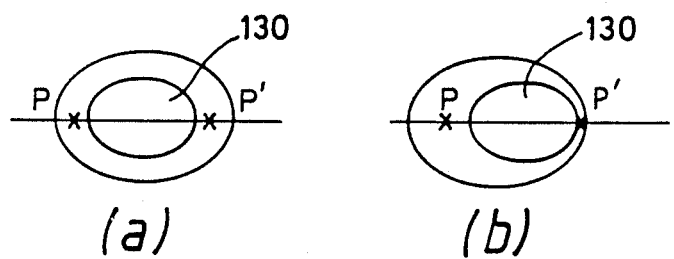
FIG. 14 shows the images obtained (a) with normal incidence and (b) with tilted incidence.

FIGS. 14(a) and 14(b) show what will be seen in the images reproduced from scanning the specimen feature 130 of FIG. 13 (assuming it is generally elliptical when viewed from above). FIG. 14(b) clearly shows the shift produced by tilting the beam axis.

Figure 15:
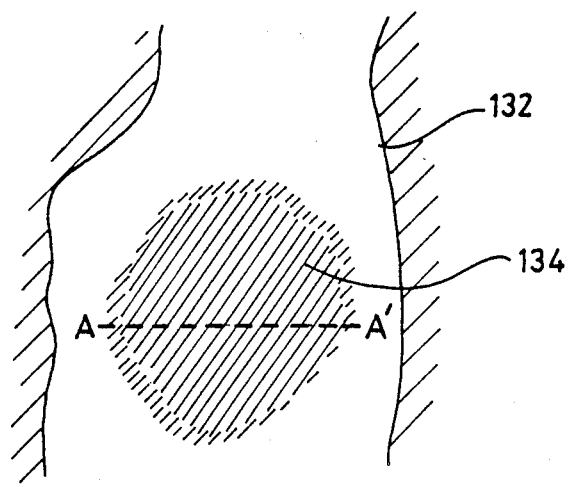
FIG. 15 is a line drawing of a micrograph of a metal track with a via hole.

FIG. 15 shows a metal track 132 of an intergrated circuit having a via hole 134 crossed by a scan line AA.

Figure 16:
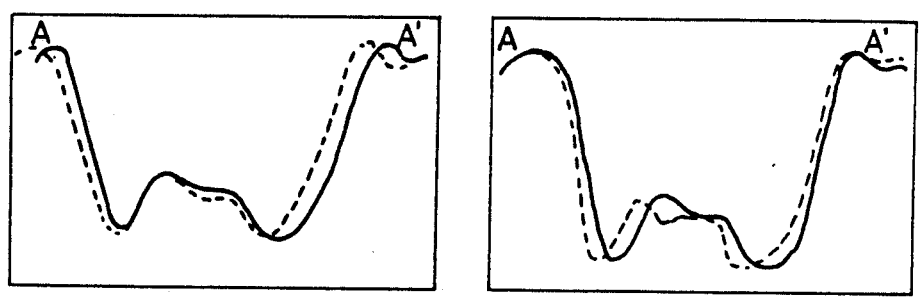
FIGS. 16a and 16b show that the scanned intensity variation along the line AA of FIG. 15 for focus at the bottom and the top of the via, respectively.

FIG. 16(a) shows the CRT traces of two oppositely tilted beams scanning along AA with the focal plane at the bottom of the via 134 and in FIG. 16(b) at the top of the via 134. Coincidence of the image demonstrates where focus is achieved. Dynamic adjustment of the focusing current If will allow coincidence to be achieved at all points on the curves.

Although not shown, a non linear input/output characteristic signal processing means may be provided to process the finally produced focus controlling signal to convert the latter into a more accurate representation of height variation in the surface. Alternatively a "look-up-table" converter may be provided.

Whereas reference has been made to the visual separation of the two images using colour, it is to be understood that the invention is in no way limited to the stereoscopic presentation of the two video signals by using different colours and instead use may be made of the three-dimensional monitor recently developed by Tektronix Ltd in which two different images may be displayed each in full colour, on the same screen, with visual separation using differently polarized light.

The procedure outlined above may be repeated for all points of a surface so that an electrical description of the topography of an entire surface may be obtained.

A breakdown of the various steps in the automated procedure allows a more detailed analysis of the scanning and the production of the topography description, to be presented. Thus:

Image acquisition

In the first estimate of topography for a single line, two images $f_1$ and $g_1$ are acquired and stored corresponding to the specimen being scanned by a normal and tilted beam. The focus is fixed initially somewhere in the proximity of the specimen. The topography will be expressed as relative heights from this focus plane.

Estimate of image shifts

An acceptance window of length w and height b is defined for each image.

If the window in the first image is considered to be centred on point n then the points defined by the window in the first image can be described in the general case by the expression $f_{1,n}(i,j)$.

In a similar manner a window of points in the second image can be described in the general case by the expression lies between $(n-w/2)$ and $(n+w/2)$ or $(m-w/2)$ and $(m+w/2)$. Correlation as between the image content at point n in the $f_{1n}(i,j)$ window and the image content at point m in the $g_{1}m(i,j)$ window is given by the expression $$c_n(m) = S\,[f_{1,n}(i,j) \cdot g_{1n}(i,j)/(f_{1,n}(i,f))^2]$$

( S denotes the sum of all the values of the following expression for all possible values of i and j for given values of n and m)

Optical correlation is indicated when the value of $C_n(m)$ is a maximum.

Thus the point p can be determined at which the correlation function has maximum value and the shift $S_{1n}$ between the normal and tilted images is given by $(p-n)^1$ i.e. $S_{1n} = (p-n)$ (n being the point at which maximum correlation would be expected but for the effect of the shift due to the tilted beam).

A similar shift signal can be obtained for all values of n along the line in the normal image.

As previously described, an iterative process of correlation can be utilized to obtain a "best profile match" between signals obtained during two scans.

The process is terminated when the residual error satisfies a pre-defined error criterion. An r.m.s. error criterion may be used, for example.

Final estimate

The final estimate of topography is contained in the array of height values $h_{k,n}$. (for all values of n for which a height value is computed).

Extension to measurement of relative heights between two points

In this case, the scan line may be reduced to the window size w which defines a point of interest. The process remains the same, except that only one point is being considered in the normal image. After the height of the first point has been obtained (relative to some initial height of the focal plane), the procedure may be repeated for a second point of interest. The height difference between the two points is then the difference of the relative heights so obtained. This may be seen as a subset of the process previously described, with much less computation involved as only two points are of interest as opposed to an entire line or frame scan.

We claim:

1. Scanning beam apparatus adapted to display two views of a surface for stereoscopic viewing, wherein two series of electrical signals are obtained by scanning the surface with a beam first with the beam axis at one angle to the surface and then with the beam axis at a different angle or direction from the first, characterized by a frame store to which the two series of electrical signals are supplied, the frame store including a feedback loop and input and feedback multiplying means and forming a recursive filter, and signal converter means including an red/green/blue look-up table memory means for generating red, green and blue signals for display by a color monitor.

2. Scanning beam apparatus as set forth in claim 1 wherein alternate tilting of the beam to enable a surface to be viewed at different angles is achieved by an electromagnetic alignment system having gun alignment coils wherein the currents flowing in the gun alignment coils are adjusted during alternate scans so as to shift the beam, and simultaneously introducing an offset in the signals applied to at least one other element in the beam forming and focusing assembly, to counteract the shift introduced by the alignment adjustment.

3. Scanning beam apparatus as set forth in claim 1 wherein alternate tilting of the beam to enable a surface to be viewed at different angles is achieved by an electrostatic system having gun alignment electrodes wherein the electrical signals supplied to the gun alignment electrodes are adjusted during alternate scans so as to shift the beam, and simultaneously introducing an offset in the signals applied to at least one other element in the beam forming and focusing assembly, to counteract the shift introduced by the alignment adjustment.

4. Scanning beam apparatus which is adapted to produce two series of electrical signals one of which is obtained by scanning a surface with a beam whose axis is at one angle at the surface and the other of which is obtained by scanning the same surface with the axis of the beam at a different angle at the said surface, and in which two video signals are obtained in manner known per se from the two series of signals for display on a single visual display device with the image produced in the display by the one signal being visually separable from that produced by the other signal, wherein the point of intersection of the two axes of the beam follows the focal plane as the focus is altered, and a calibrated focal plane adjustment means is provided whereby a depth measurement as between two different points in the object one being spaced by a different amount from the beam forming assembly than the other can be obtained, as a direct reading, by adjusting the position of the focal plane of the beam so as to first coincide with the one and then the other of the two points and by determining from the calibration the distance between the two points, in each case the position of coincidence of the focal plane and the respective point being determined by adjustment of the calibrated focal plane adjustment means so as to cause the two visually separable images of the said point in the display to merge.

5. Scanning beam apparatus as set forth in claim 4 characterized by a frame store to which the two series of electrical signals are supplied, the frame store including a feedback loop and input and feedback multiplying means and forming a recursive filter, and signal converter means including an red/green/blue look-up table memory means for generating red, green and blue signals for display by a color monitor.

6. Scanning beam apparatus as set forth in claim 5 wherein alternate tilting of the beam to enable a surface to be viewed at different angles is achieved by an electromagnetic alignment system having gun alignment coils wherein the currents flowing in the gun alignment coils are adjusted during alternate scans so as to shift the beam, and simultaneously introducing an offset tin the signals applied to at least one other element in the beam forming and focusing assembly, to counteract the shift introduced by the alignment adjustment, whereby the point of intersection of the two axes of the beam follows the focal plane as the focus is altered.

7. Scanning beam apparatus as set forth in claim 5 wherein alternate tilting of the beam to enable a surface to be viewed at different angles is achieved by an electrostatic system having gun alignment electrodes wherein the electrical signals supplied to the gun alignment electrodes are adjusted during alternate scans so as to shift the beam, and simultaneously introducing an offset in the signals applied to at least one other element in the beam forming and focusing assembly, to counteract the shift introduced by the alignment adjustment, whereby the point of intersection of the two axes of the beam follows the focal plane as the focus is altered.

8. A method of determining the difference in height between two points in a surface in the field of view of a scanning beam apparatus, measured in a direction generally parallel to the beam, in which the surface is scanned first with the axis of the beam at one angle and then at a different angle, so as to obtain two series of electrical signals describing the surface for topographical analysis also for display on visual display means, the displayed image corresponding to the one series of signals being visually distinguishable from the image corresponding to the other series, and in which the point of intersection of the two beam axes follows movement of the focal plane caused by adjustment of the focus, and wherein calibrated control means for adjusting the position of the focal plane is provided, comprising the steps of:
 (1). adjusting the control means so as to move the focal plane relative to the surface and observing the two images of the one point in the display whilst adjusting the said control until displacement of the two images of the one point is at a minimum, (at which position the focal plane will substantially coincide with the surface in the immediate vicinity of the one point),
 (2). repeating step (1) whilst concentrating on the said other point, and
 (3). noting the difference between the calibrated values of the control means at the two points of focal plane and surface coincidence.

9. In a system for generating an electrical signal which describes the topography of a surface using a charged particle beam scanning apparatus which is adapted to produce two series of electrical signals one of which is obtained by scanning the surface with a beam whose axis is at one angle at the surface of the object and the other of which is obtained by scanning the same object with the axis of the beam at a different angle at the said surface, and in which the point of intersection of the two axes of the charged particle beams follows the focal plane as the focus is altered, and in which two video signals are obtained from the two series of electrical signals and in which means is provided to effect adjustment of the position of the focal plane; the improvement comprising the steps of:
 (1) correlating the two video signals so obtained and deriving a correlation signal whose value for each point in the surface indicates the apparent shift in position of that point as between the two beam scans, and
 (2) processing the correlation signal as an electrical description of the topography of the scanned surface.

10. A system as set forth in claim 9 wherein the correlation signal is normalized relative to a reference value, by combination with an offset signal.

11. The system as set forth in claim 9 further comprising the step of generating a focus adjusting signal from the correlation signal.

12. A system as set forth in claim 11 further comprising the step of employing the focus adjusting signal during a successive scan and deriving a further correlation signal for combination with the first correlation signal to produce a more accurate description of the surface topography and in turn a more accurate focus adjusting signal.

13. A system as set forth in claim 12 wherein the step of employing the focus adjusting signal during a successive scan and deriving a further correlation signal is repeated to produce ever more accurate focus adjusting signals by a process of successive approximation during a succession of scans, using previously computed focus adjusting signals to adjust the beam focus during successive scans and processing the final focus adjusting signal as the electrical signal descriptive of the topography of the scanned surface.

14. A system as set forth in claim 9 wherein the focus adjusting signal is processed by a signal processing means having a non-linear input/output characteristic.

15. A system as set forth in claim 9 wherein a look-up table of corrected height values is provided, for providing the height signal from the focus adjusting signal values.

16. A system as set forth in claim 9 wherein alternate tilting of the beam to enable the surface to be viewed at different angles is achieved by an electromagnetic alignment system having gun alignment coils wherein the currents flowing in the gun alignment coils are adjusted during alternate scans so as to shift the beam, and simultaneously introducing an offset in the signals applied to at least one other element in the beam forming and focusing assembly, to counteract the shift introduced by the alignment adjustment, whereby the part of intersection of the two axes of the beam follows the focal plane as the focus is altered.

17. A system as set forth in claim 9 wherein alternate tilting of the beam to enable the surface to be viewed at different angles is achieved by an electrostatic system having gun alignment electrodes wherein the electrical signals supplied to the gun alignment electrodes are adjusted during alternate scans so as to shift the beam, and simultaneously introducing an offset in the signals applied to at least one other element in the beam forming and focusing assembly, to counteract the shift introduced by the alignment adjustment, whereby the point of intersection of the two axes of the beam follows the focal plane as the focus is altered.

18. A system claimed in claim 9 further comprising a signal processing system and visual display means to which the two video signals are supplied, operating so that the image produced by the one signal is visually separable from that produced by the other signal.

19. A system as set forth in claim 18 characterized by a frame store to which the two series of electrical signals are supplied, the frame store including a feedback loop and input and feedback multiplying means and forming a recursive filter and signal converter means including an red/green/blue look-up table memory means for generating red, green and blue signals for display by a color monitor.

20. A charged particle beam scanning apparatus wherein alternate tilting of the beam to enable the surface to be viewed at different angles is achieved by an electromagnetic alignment system having gun alignment coils wherein the currents flowing in the gun alignment coils are adjusted during alternate scans so as to shift the beam, and simultaneously introducing an offset in the signals applied to at least one other element in the beam forming and focusing assembly, to counteract the shift introduced by the alignment adjustment, whereby the point of intersection of the two axes of the beam follows the focal plane as the focus is altered.

21. A charged particle beam scanning apparatus wherein alternate tilting of the beam to enable the surface to be viewed at different angles is achieved by an electrostatic system having gun alignment electrodes wherein the electrical signals applied to the gun alignment electrodes are adjusted during alternate scans so as to shift the beam, and simultaneously introducing an offset in the signals applied to at least one other element in the beam forming and focusing assembly, to counteract the shift introduced by the alignment adjustment, whereby the point of intersection of the two axes of the beam follows the focal plane as the focus is altered.

* * * * *

UNITED STATES PATENT AND TRADEMARK OFFICE
CERTIFICATE OF CORRECTION

PATENT NO. : 4,943,722

DATED : July 24, 1990

INVENTOR(S) : Bernard C. Breton, et al

It is certified that error appears in the above-identified patent and that said Letters Patent is hereby corrected as shown below:

ON THE TITLE PAGE:

Delete "[73] Assignee: Trialsite Limited, United Kingdom."

Signed and Sealed this

Twenty-eighth Day of January, 1992

*Attest:*

HARRY F. MANBECK, JR.

*Attesting Officer*      *Commissioner of Patents and Trademarks*